(12) United States Patent
Kim et al.

(10) Patent No.: US 6,383,345 B1
(45) Date of Patent: May 7, 2002

(54) METHOD OF FORMING INDIUM TIN OXIDE THIN FILM USING MAGNETRON NEGATIVE ION SPUTTER SOURCE

(75) Inventors: Steven Kim, Harrington Park; Daeil Kim, Hackensack, both of NJ (US)

(73) Assignee: Plasmion Corporation, Hoboken, NJ (US)

( * ) Notice: Subject to any disclaimer, the term of this patent is extended or adjusted under 35 U.S.C. 154(b) by 0 days.

(21) Appl. No.: 09/742,331

(22) Filed: Dec. 22, 2000

Related U.S. Application Data
(60) Provisional application No. 60/239,915, filed on Oct. 13, 2000.

(51) Int. Cl.[7] .............................................. C23C 14/34
(52) U.S. Cl. .............................. 204/192.11; 204/192.29
(58) Field of Search ....................... 204/192.11, 192.22, 204/192.26, 192.29

(56) References Cited

U.S. PATENT DOCUMENTS 4,416,517 A * 11/1983 Beall et al. ................. 350/357
5,844,225 A * 12/1998 Kimock et al. ............. 235/462

FOREIGN PATENT DOCUMENTS

JP 11-279756 * 12/1999 ........... C23C/14/34

* cited by examiner

*Primary Examiner*—Nam Nguyen
*Assistant Examiner*—Steven H. VerSteeg
(74) *Attorney, Agent, or Firm*—Morgan, Lewis & Bockius LLP

(57) ABSTRACT

A method for forming an indium tin oxide thin film on a substrate in the present invention includes the steps of introducing a mixture of an inert gas and a low electron affinity element in close proximity to a target as a primary sputter ion beam source, providing an oxygen gas between the target and the substrate, applying an electrical energy to the target to ionize the mixture, confining electrons generated in the ionization in close proximity to a surface of the target facing towards the substrate, disintegrating negatively charged ions from the target, and forming the indium tin oxide thin film on the substrate.

21 Claims, 11 Drawing Sheets

METHOD OF FORMING INDIUM TIN OXIDE THIN FILM USING MAGNETRON NEGATIVE ION SPUTTER SOURCE

This application claims the benefit of a provisional application, entitled "Method of Forming Indium Tin Oxide Thin Film Using Magnetron Negative Ion Sputter Source," which was filed on Oct. 13, 2000, and assigned Provisional Application No. 60/239,915, which is hereby incorporated by reference.

BACKGROUND OF THE INVENTION

1. Field of the Invention

The present invention relates to a method of forming a thin film, and more particularly, to a method of forming an indium tin oxide thin film using a magnetron negative ion sputter source.

Although the present invention is suitable for a wide scope of applications, it is particularly suitable for forming an indium tin oxide thin film at a low temperature which has a high transmittance as well as a high electrical conductivity.

2. Discussion of the Related Art

An indium tin oxide (ITO) thin film has been widely used in optoelectronic devices, such as a solar cell, a liquid crystal display (LCD), and a flat panel display, due to its unique properties of a high transmittance in visible light region and a high electrical conductivity. A resistivity of the ITO thin film depends on a tin doping level and a concentration of oxygen vacancies. Also, its high optical transmittance stems from the high intrinsic band gap energy of 3.5 eV. The ITO thin film is normally deposited by the conventional magnetron sputtering using a ceramic target or by electron beam evaporation in a controlled oxygen ambient condition with heating a substrate or a post annealing at the temperature in the range of 300 to 400° C.

For a color filter application in an LCD and a flat panel display, a substrate processing temperature is limited to below 250° C. because an ITO is deposited on a heat-sensitive polymer substrate. As a result, a substrate temperature should be low enough ($\leq 150°$ C.) to prevent thermal damage. Therefore, a low temperature deposition technique is the key process in manufacturing optoelectronic devices having an ITO thin film as a conducting electrode.

Conventionally, the ITO thin film was formed on an organic substrate at a low temperature using spray coating, screen coating, or electroless plating. In those techniques, process parameters such as a target composition, a substrate (or processing) temperature, an oxygen partial pressure, and a deposition rate should be controlled to obtain a high optical transmittance and a low resistivity in the ITO thin film. However, all of these films tend to have either a high resistivity or a low optical transmittance. A resistivity and an optical transmittance of the commercially available ITO films are higher than $2 \times 10^{-4}$ $\Omega$cm and lower than 87% (on glass), respectively. Thus, there is a need to develop a process for forming an ITO thin film having a high transmittance as well as a high electrical conductivity.

SUMMARY OF THE INVENTION

Accordingly, the present invention is directed to a method of forming indium tin oxide thin film using a magnetron negative ion sputter source that substantially obviates one or more problems due to limitations and disadvantages of the related art.

An object of the present invention is to provide a method for forming an indium tin oxide thin film at a low temperature that has a high transmittance as well as a high electrical conductivity.

Additional features and advantages of the invention will be set forth in the description which follows and in part will be apparent from-the description, or may be learned by practice of the invention. The objectives and other advantages of the invention will be realized and attained by the structure particularly pointed out in the written description and claim hereof as well as the appended drawings.

To achieve these and other advantages and in accordance with the purpose of the present invention, as embodied and broadly described, a method for forming an indium tin oxide thin film on a substrate in the present invention includes the steps of introducing a mixture of an inert gas and a low electron affinity element in close proximity to a target as a primary sputter ion beam source, providing an oxygen gas between the target and the substrate, applying an electrical energy to the target to ionize the mixture, confining electrons generated in the ionization in close proximity to a surface of the target facing towards the substrate, disintegrating negatively charged ions from the target, and forming the indium tin oxide thin film on the substrate.

In another aspect of the present invention, a method for forming an indium tin oxide thin film using a sputter system, the method includes the steps of cleaning a substrate in acetone, ethanol, and distilled water sequentially and drying the substrate, placing the substrate in a process chamber, evacuating the process chamber where a sputter action occurs between a target and the substrate, wherein the target has first and second sides, introducing a mixture of argon and cesium to the second surface of the target as a primary sputter ion beam source, wherein the target has at least one through-hole, diffusing the mixture through the through-hole in the target from the second surface to the first surface, providing an oxygen gas between the target and the substrate, maintaining the process chamber to have a constant working pressure, applying an electrical energy to the target to ionize the mixture, confining electrons generated in the ionization in close proximity to the first surface of the target, disintegrating negatively charged ions from the target, and forming the indium tin oxide thin film on the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

In the present invention, a polycrystalline ITO thin film having a high optical transmittance and a high electrical conductivity is obtained without heating a substrate. The process is similar to the magnetron negative ion sputtering disclosed in U.S. patent application Ser. No. 09/568,665, which is hereby incorporated by reference in its entirety.

In addition to argon ions ($Ar^+$), cesium ions ($Cs^+$) are also used as the primary ion beam to sputter the target in the present invention. In this process, the Ar ions are simultaneously introduced with the Cs ions through the same supply line to prevent the Cs ions from reacting with oxygen, which is normally provided for a reactive sputtering process. It has been determined that the use of Cs ions as the first bombarding ion source produces a high yield of oppositely charged ions from the metal targets. This is because a cesium coating on the sputtering target surface lowers the work function required to sputter negative ions from the target materials due its a low electron affinity. Although other elements with a low electron affinity, such as rubidium and potassium, will also lower the work function, cesium is the most efficient in this regard among any non-radioactive elements. Thus, a high ratio of the negatively charged sputtered ions (more than 20%) is generated by the surface ionization process. Sputtered negative secondary ions are accelerated to the substrate by the potential difference between the target and the substrate and then deposited on the substrate. The negatively charged ions will have an ion beam energy approximately the same as the potential difference between the target and the substrate. The ion beam energy decreases with a high working pressure. Thus, by controlling the working pressure, the ion beam energy is also controlled to have a desired ion beam energy.

Figure 1:
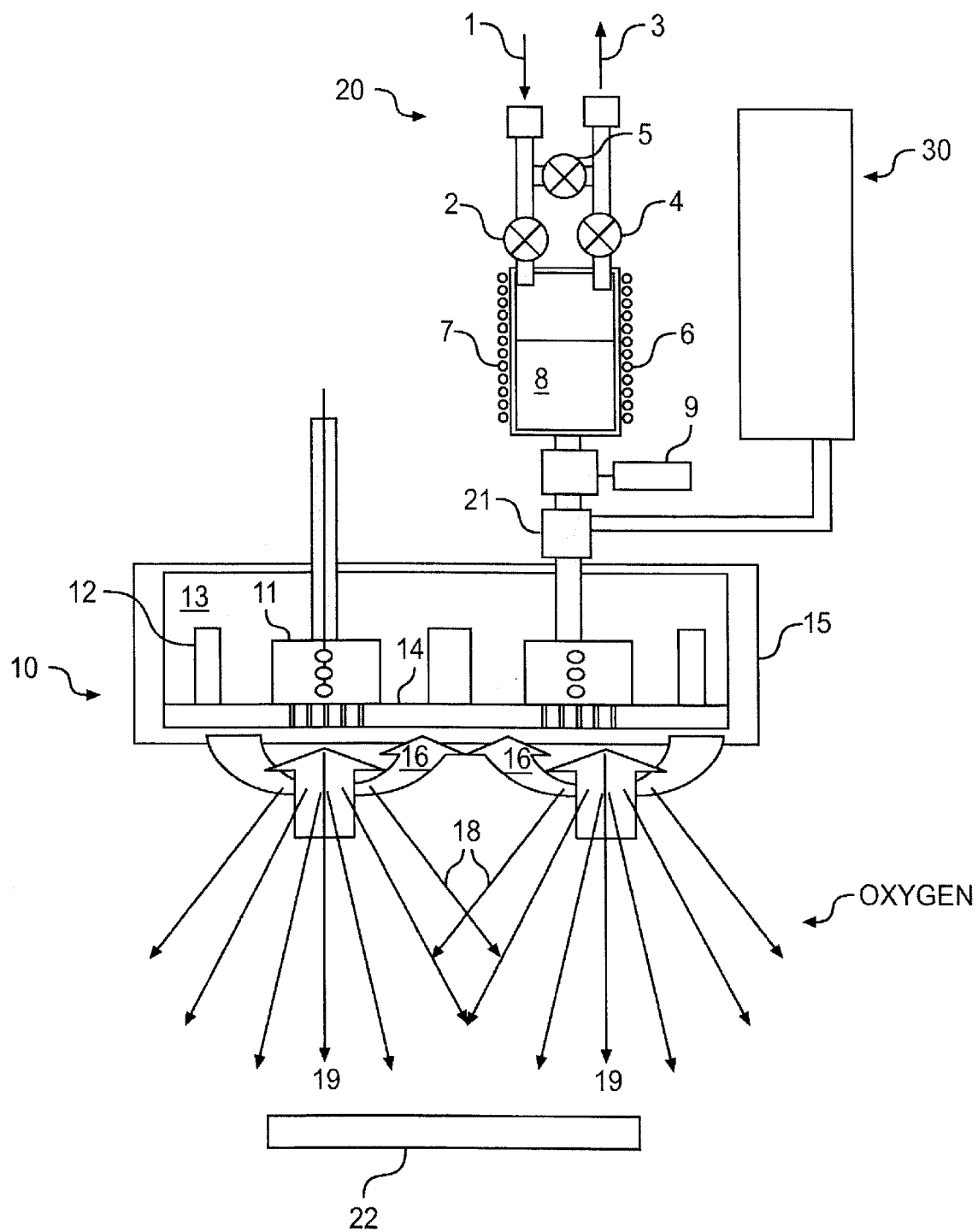
FIG. 1 is a schematic diagram illustrating a magnetron negative ion sputter system to practice embodiments of the present invention.

FIG. 1 is a schematic diagram illustrating a magnetron negative ion sputter system to practice embodiments of the present invention. As shown in FIG. 1, the system includes a magnetron sputter device 10, a cesium introduction system 20, and a argon source 30.

More specifically, the magnetron sputter device 10 includes a sputter unit cesium distribution chamber 11, permanent magnets 12, a sputter body 13, a target having pinholes 14, and a sputter outer shield 15. The sputter unit cesium distribution chamber 11 having a donut shape uniformly distributes cesium onto the target 14. The permanent magnets 12 located below the target 14 provide magnetic fields for confining electron movements over the target 14 (i.e., creating a dense plasma) throughout the sputtering process. The sputter body 13 enclosing the sputter unit cesium distribution chamber 11 is made of metal, preferably copper. Cesium ions diffuses out to the surface of target 14 through pinholes. A substrate faces toward the target 14 in the system. The sputter outer shield 15 acts as a ground potential shield for the sputter unit cesium distribution chamber 11 and exposes the target to the substrate.

The cesium introduction system 20 includes a port 1 preferably capable of accepting a cesium ampule. Because cesium is highly reactive with oxygen, the port 1 is preferably capable of accepting a cesium ampule without allowing the cesium to contact the atmosphere. Cesium is conveyed to a reservoir 6 through a shut off valve 2, located between the port 1 and the reservoir 6. An additional port 3 may be provided to allow the cesium reservoir 6 to be evacuated in order to maintain confined cesium atoms in an oxygen free environment. Valves 4 and 5 facilitate controlling evacuation and cesium flow. The cesium 8 is maintained in a liquid state in the reservoir 6. A heater 7 enables heating of the reservoir 6 in order to make the cesium 8 transportable. A metering valve 9 controls an amount of the cesium 8 flowing into the distribution chamber 11. An insulator 21 provides electrical and temporal insulation between the heated cesium 8 and the ground potential cesium in the distribution chamber 11.

The cesium introduction system 20 is operated by first coupling a sealed ampule, containing cesium, to the port 1. Valves 2 and 4 are closed, while a valve 5 is opened and the cesium line is evacuated, or pumped down. Once pumping down is complete, the valve 5 is closed and the seal on the cesium ampule is broken. The valve 4 is then opened and the reservoir 6 is pumped down. When pump down of the reservoir 6 is complete, the valve 2 is opened, allowing the cesium to flow into the reservoir 6. A heater 7 is enabled and adjusted to control the temperature of the cesium 8 in the reservoir 6. A metering valve 9 is used to control an amount of cesium being fed to the distribution chamber 11.

As described above, cesium is highly reactive with oxygen and, as such, is easily contaminated. Feeding cesium to the target from an inner surface, that is a surface inside the body 13 of the sputter device, is advantageous in that the cesium has less exposure to the environment and is less likely to be contaminated.

Further, an argon source 30 is provided in the sputter system in the present invention. The argon source 30 connects to the end portion of the cesium introduction system 20. Therefore, argon and cesium are simultaneously provided to the distribution chamber 11 through the same supply line, thereby further preventing cesium from contamination by oxygen.

A method of forming an ITO thin film according to the present invention will be explained more fully as follows:

The target 14 in the present invention, for example, is a 1-inch diameter target containing 90 wt % $In_2O_3$–10 Wt % $SnO_2$. The substrate is a glass for example, corning 7059 glass). The substrate is sequentially rinsed in acetone, ethanol, distilled water, dried with a nitrogen gas, and then placed over the target at the distance of 8 cm and then rotated at 10 rpm.

Prior to deposition, the process chamber was evacuated to about 1×10$^{-7}$ Torr. Cesium and argon ions as a mixture are simultaneously introduced in close proximity to the surface of the target facing toward the substrate 22 through the cesium distribution system 20 and the argon reservoir 30. Other inert gases, such as xenon (Xe) and helium (He), may be used instead of argon. Thereafter, a pure oxygen gas is introduced into the process chamber through a needle valve. A working pressure is kept constantly at around 1×10$^{-4}$ Torr.

An ion beam energy (for example, a DC potential) in the range of 25 eV to 1000 eV is applied to the target 14. The substrate may be either grounded or positively biased in order to attract the negatively charged ions from the target 14. When the substrate is grounded, a potential difference between the substrate and the target is the same as the applied ion beam energy, so that the negatively charged ions from the target will have approximately the same kinetic energy as the potential difference. As mentioned above, the magnets 12 generate magnetic fields 16 which confine electrons generated by an ionization process to a path on the outer surface of target 14 corresponding to the shape (i.e., circular) of the cesium distribution chamber 11. A plasma discharge 18 includes electrons, argon ions, and argon neutrals. The argon ions and the cesium ions are accelerated toward the target 14 because the target 14 holds a negative potential relative to the plasma discharge 18. The action of the argon ions and the cesium ions is shown by arrows 17. As a result of the argon and cesium ions bombarding the target 14, electrons, neutral sputtered particles, and sputtered negative ions are ejected from the target 14, as shown by the arrows 19. The ejected ions from the target 14 are deposited on the substrate and formed as a thin film. Due to the presence of a cesium coating on the target 14 in the present invention, a high yield of the second ion beam is produced from the target surface, thereby facilitating the sputtering process.

The sputtering process in the present invention is a low temperature process due to the following mechanism. When energetic secondary ions collide with the substrate, their kinetic energies are released either as a heat energy at the very localized point of the substrate surface or as an increased adatom mobility. This additional heat energy and an increased surface mobility of adatoms result in a polycrystalline growth at the low temperatures in the range of the room temperature (about 25° C.) to 100° C.

In order to consider an effect of the secondary ion beam energy on crystallinity, resistivity, optical transmittance, and surface morphology of ITO thin films, the ion beam energy is changed from 25 eV to 1000 eV. A deposition time is adjusted to obtain a film thickness of about 60 nm, and the thickness is measured with a surface profilometer. Although the glass substrate is not heated intentionally, the substrate temperature, measured with a thermocouple (K-type) reaches about 70° C. due to a radiative heating from the ion beam bombardment as well as the radiation from the heating element of the Cs$^+$ ion source. The substrate temperature may be maintained at the room temperature by cooling the substrate. After obtaining various ITO thin film on the glass substrate using different ion beam energies under the above-described conditions, physical properties of the ITO thin films are measured by various methods.

Figure 2A:
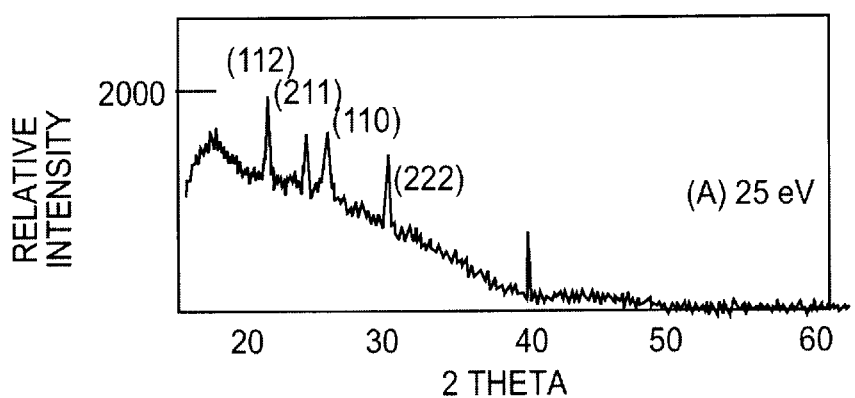
FIGS. 2A to 2D are X-ray diffraction (XRD) spectra of various indium tin oxide (ITO) thin films formed by the magnetron negative ion sputter system using different ion beam energies in the present invention.
Figure 2B:
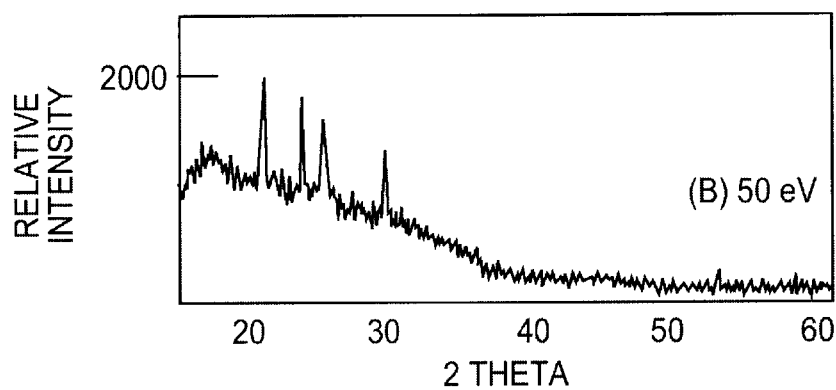
Figure 2C:
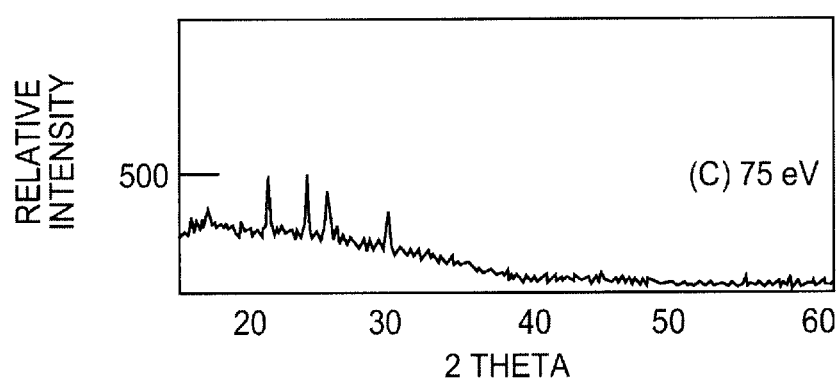
Figure 2D:
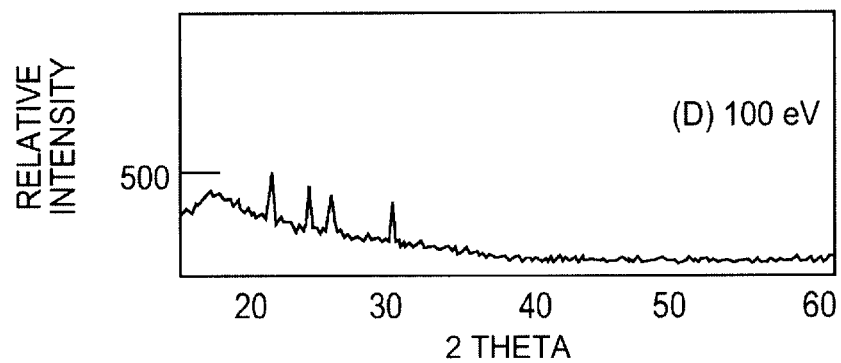

FIGS. 2A to 2D are X-ray diffraction (XRD) spectra of various indium tin oxide (ITO) thin films formed by the magnetron negative ion sputter system using different ion beam energies in the present invention. As shown in FIGS. 2A to 2D, sharp peaks in the XRD spectra illustrate that all ITO thin films are polycrystalline with a rutile structure. Grains of the films are oriented to (112), (211), (110), and (222) planes. The (112) plane is dominant in all films. Also, the XRD spectra indicate that there is an optimum ion beam energy for crystallization of the thin film. As shown in FIG. 2B, the crystallinity of the ITO film is maximized when the film is formed by applying the ion beam energy of 50 eV. Generally, the higher the ion beam energy, the higher the surface mobility of the sputtered atoms on the substrate. This is due to a higher adatom mobility leading to a higher crystallization. However, when the ion beam energy is too high, such as 75 eV and 100 eV as shown in FIGS. 2C and 2D, the crystalline phase tends to be reduced and develop amorphization presumably due to a low surface mobility.

Figure 3:
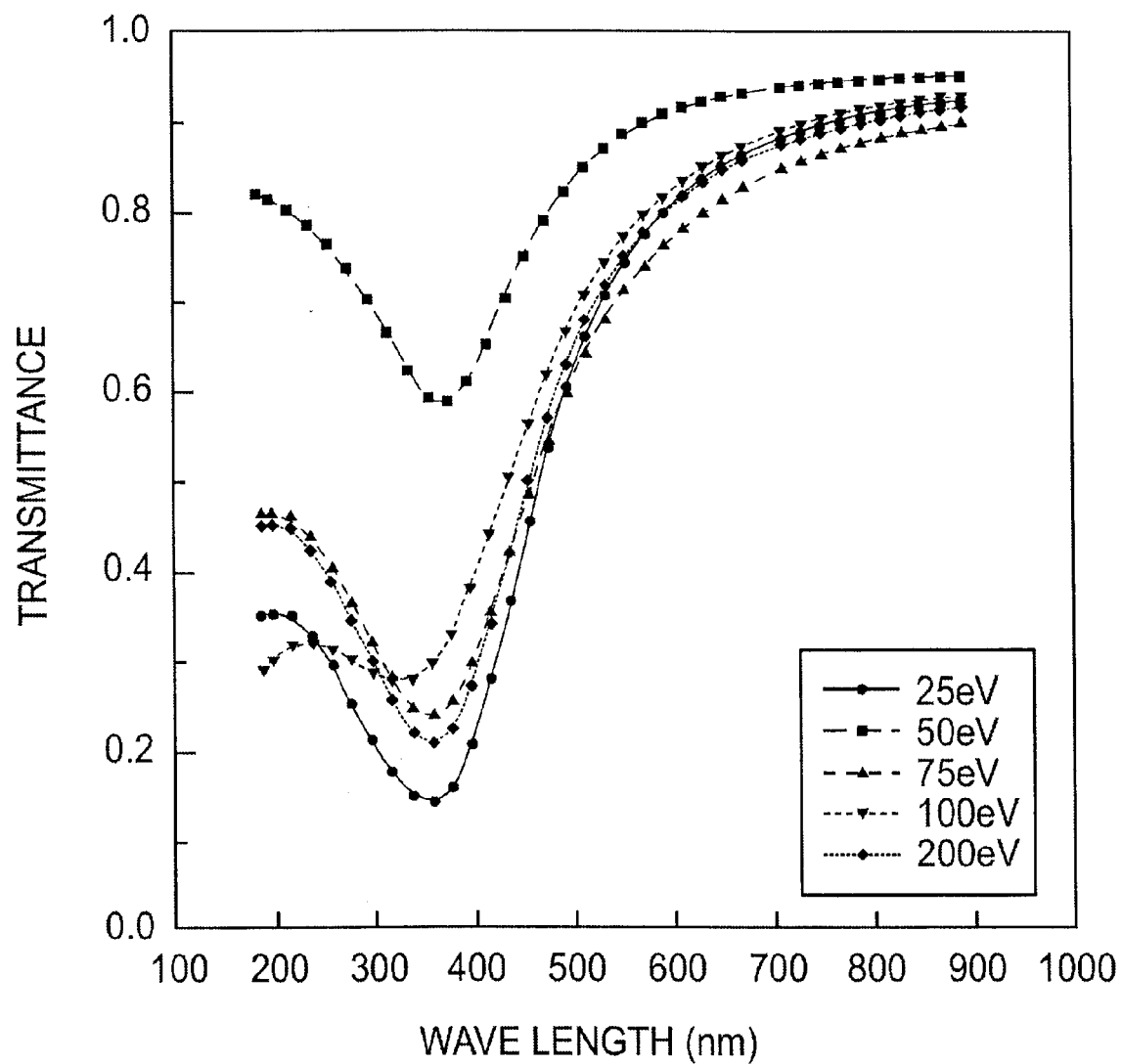
FIG. 3 is a UV-VIS-NIR spectrophotometry spectrum of the various ITO thin films formed by the magnetron negative ion sputter system using different ion beam energies in the present invention to measure optical transmittance in the visible light region.

FIG. 3 is a double beam UV-VIS-NIR spectrophotometry spectrum of the various ITO thin films formed by the magnetron negative ion sputter system using different ion beam energies in the present invention to measure optical transmittance in the visible light region. The spectrum shows an optical transmittance of the ITO films in the wavelength interval of 200 to 900 nm. The ITO thin film formed at the ion beam energy of 50 eV (showing as dark squares) has a higher optical transmittance (more than 90%) than those formed at the ion beam energies other than 50 eV in the entire wavelength range. A low optical transmittance of the ITO thin films formed at the ion beam energy of 25 eV (shown as dark circles) is caused by non-crystalline microstructures due to a low surface adatom mobility. Also, a low optical transmittance of the ITO film formed at the ion beam energies higher than 75 eV is attributed to a poor microstructure and a rough surface morphology caused by a severe energetic bombardment.

Figure 4A:
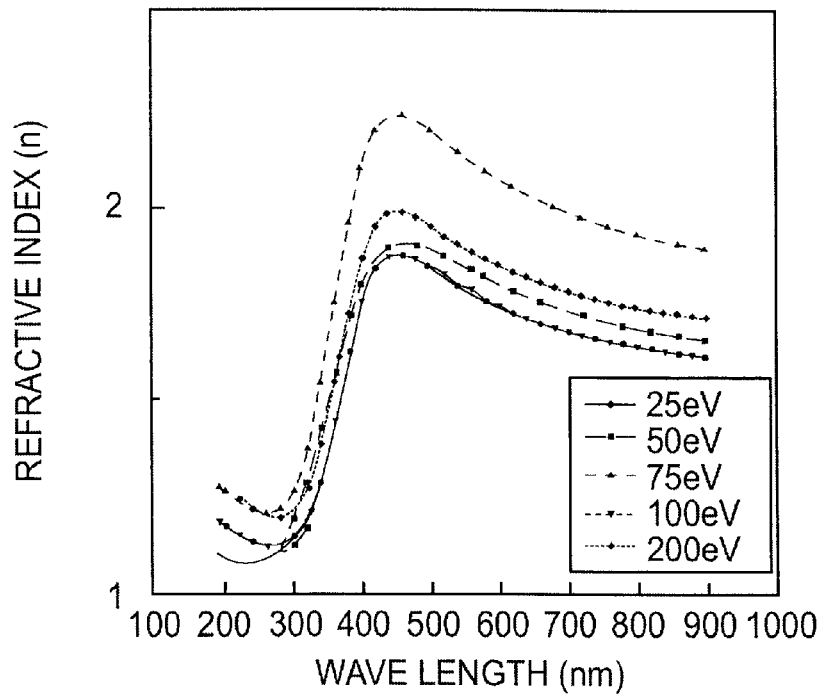
FIGS. 4A and 4B are spectra for a refraction of index (n) and reflectance of the various ITO thin films formed by the magnetron negative ion sputter system using different ion beam energies in the present invention.
Figure 4B:
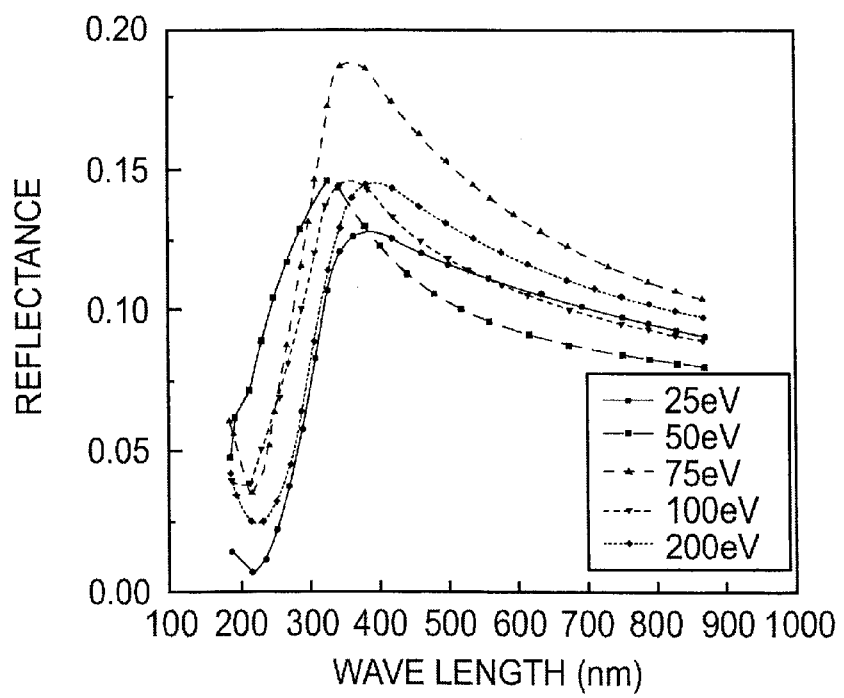
Figure 5:
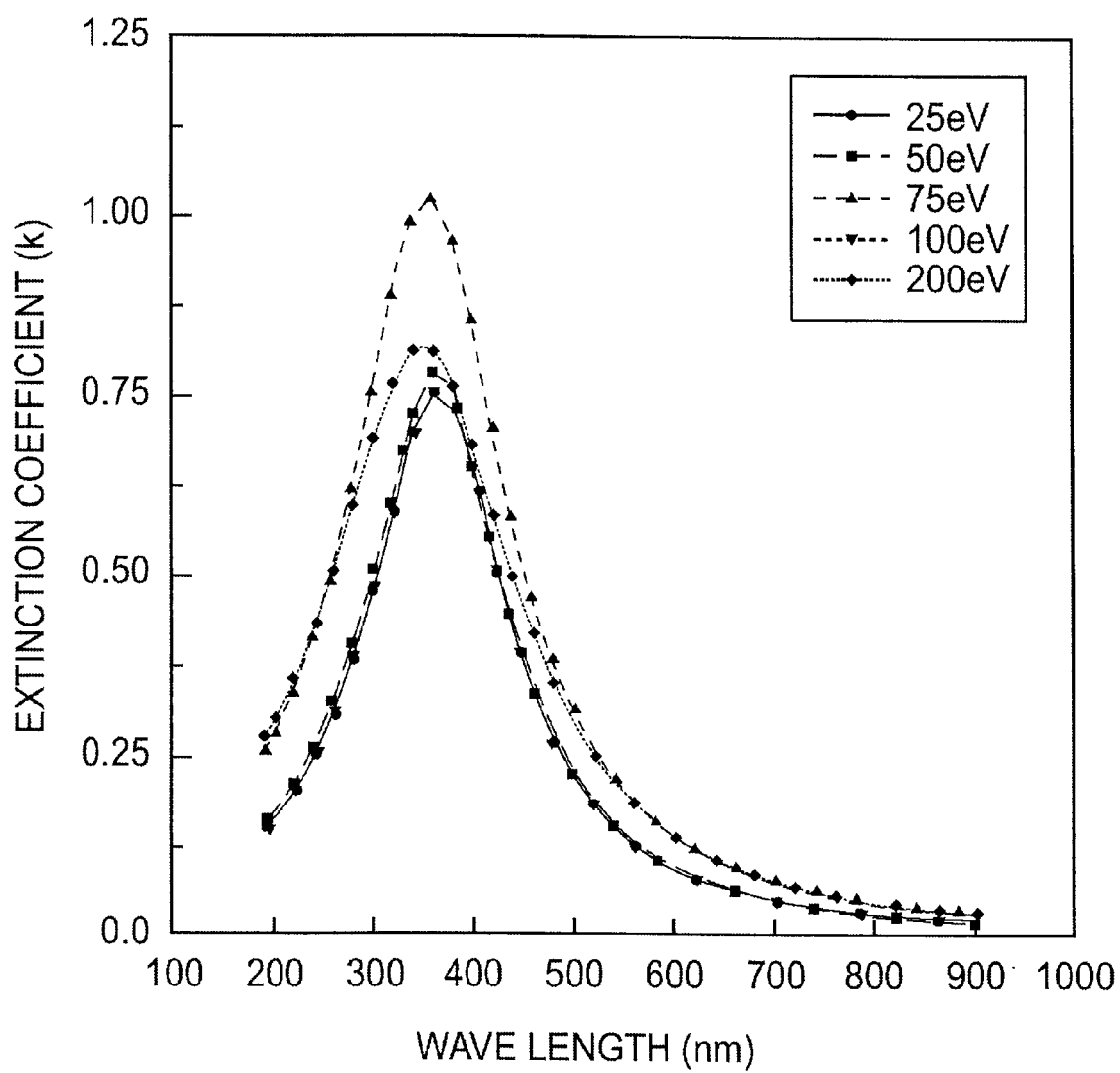
FIG. 5 is a spectrum of extinction coefficient (k) of the various ITO thin films formed by the magnetron negative ion sputter system using different ion beam energies in the present invention.

As shown in FIGS. 4A, 4B, and 5, The ITO thin films formed with the high ion beam energies have a reflectance, an index of refraction (n), and an extinction coefficient (k) much higher than those formed by using low ion beam energies. The ITO thin films deposited at 50 eV have the lowest values in a reflectance, an index of refraction (n), and an extinction coefficient (k).

Figure 6:
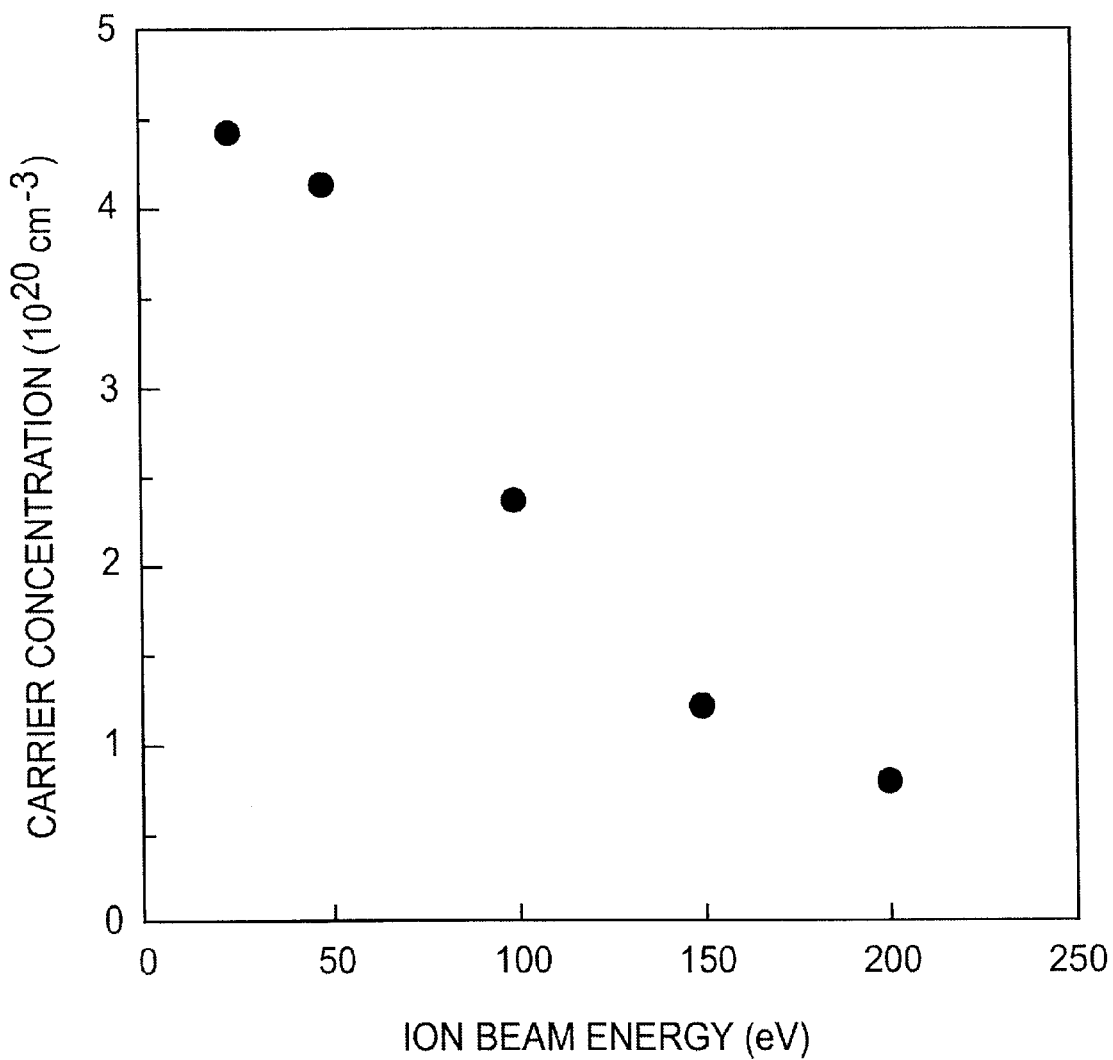
FIG. 6 shows changes in charge carrier concentration of the various ITO thin films formed by the magnetron negative ion sputter system using different ion beam energies in the present invention.

FIG. 6 shows changes in charge carrier concentrations of the various ITO thin films formed by the magnetron negative ion sputter system using different ion beam energies in the present invention. A Hall effect measurement using a Van Der Pauw method is used in determining a carrier concentration. As an ion beam energy increases, the carrier concentration decreases. Since the charge carriers of ITO films are created by oxygen vacancies, the decrease in a carrier concentration is due to an extinction of the oxygen vacancies during the deposition. When sputtered secondary ions collide with the substrate, their kinetic energy is transferred to oxygen atoms which are present on the glass substrate. As a result, the oxygen atoms diffuse into the oxygen vacancies, thereby reducing the oxygen vacancies.

Figure 7:
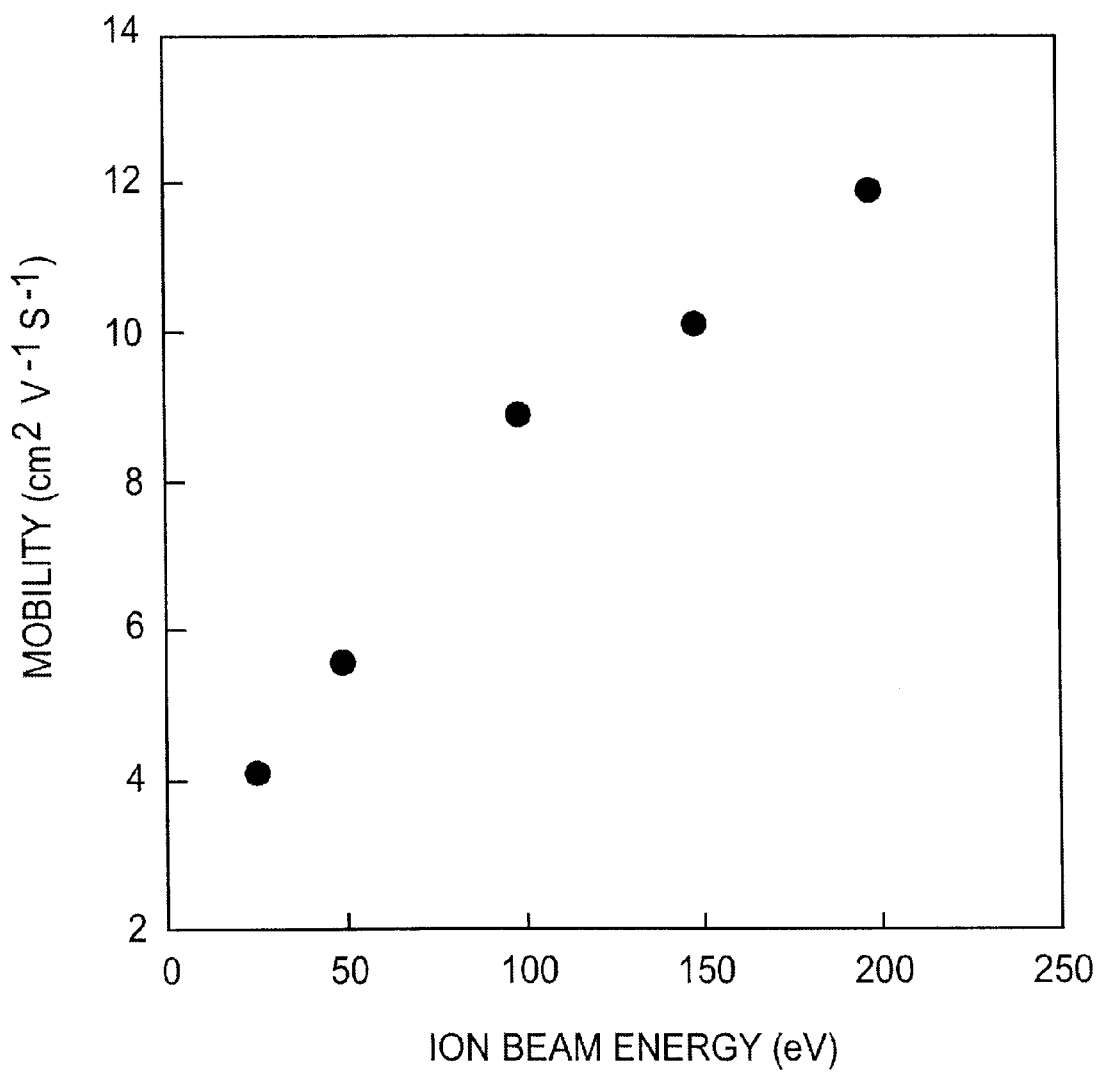
FIG. 7 shows changes in carrier mobility of the various ITO thin films formed by the magnetron negative ion sputter system using different ion beam energies in the present invention.
Figure 8A:
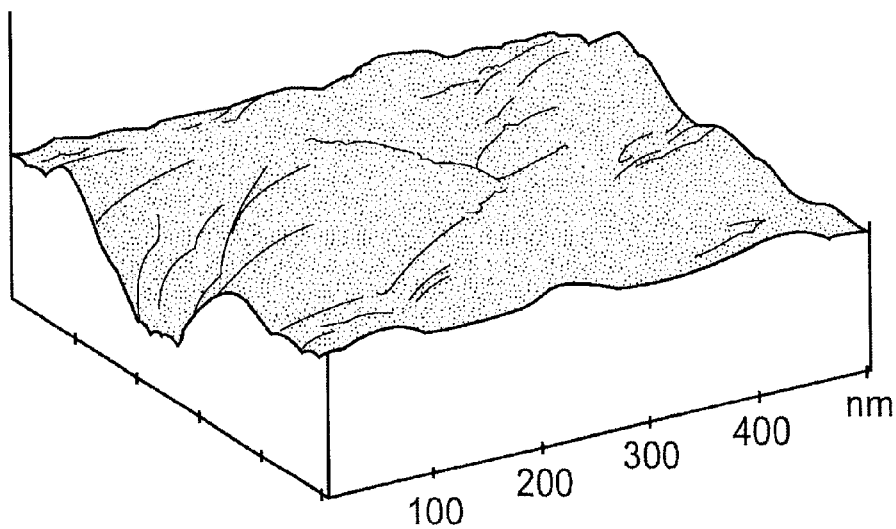
FIGS. 8A to 8E are images scanned by atomic force microscopy (AFM) of the various ITO thin films formed by the magnetron negative ion sputter system using different ion beam energies in the present invention.
Figure 8B:
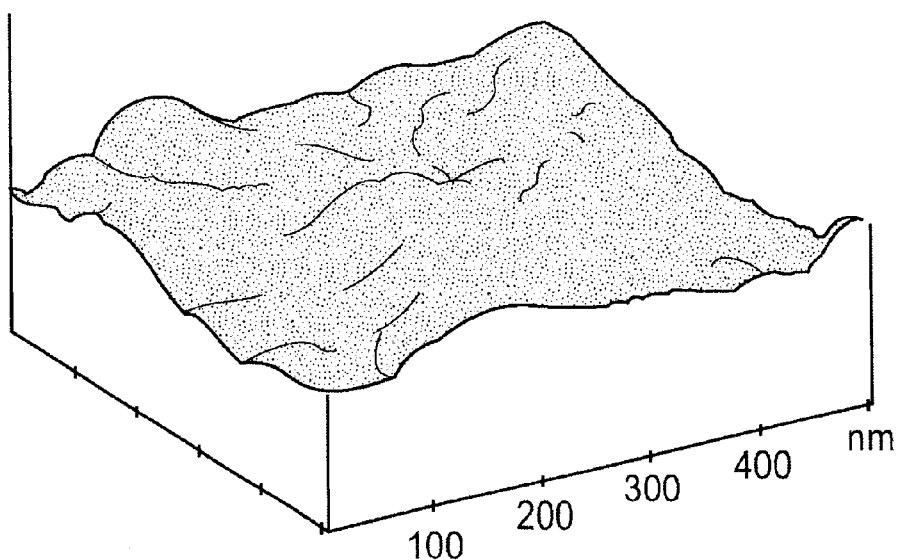
Figure 8C:
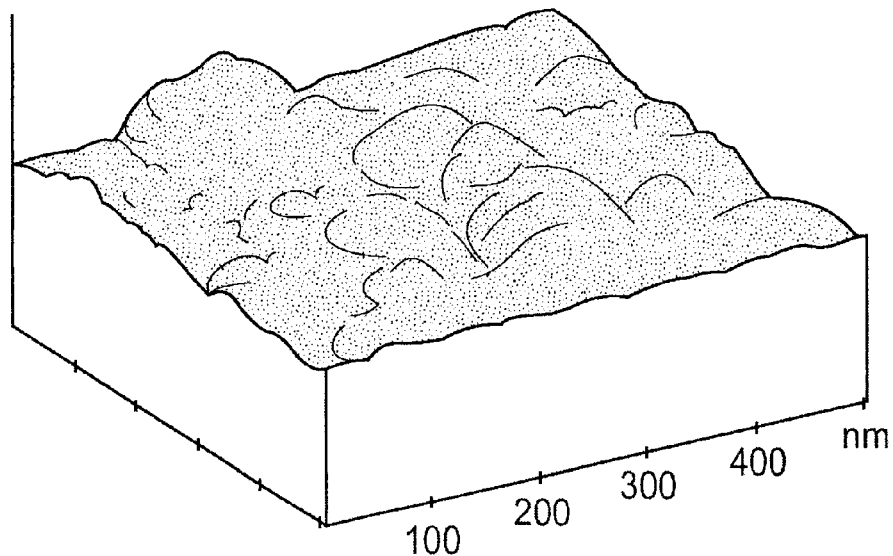
Figure 8D:
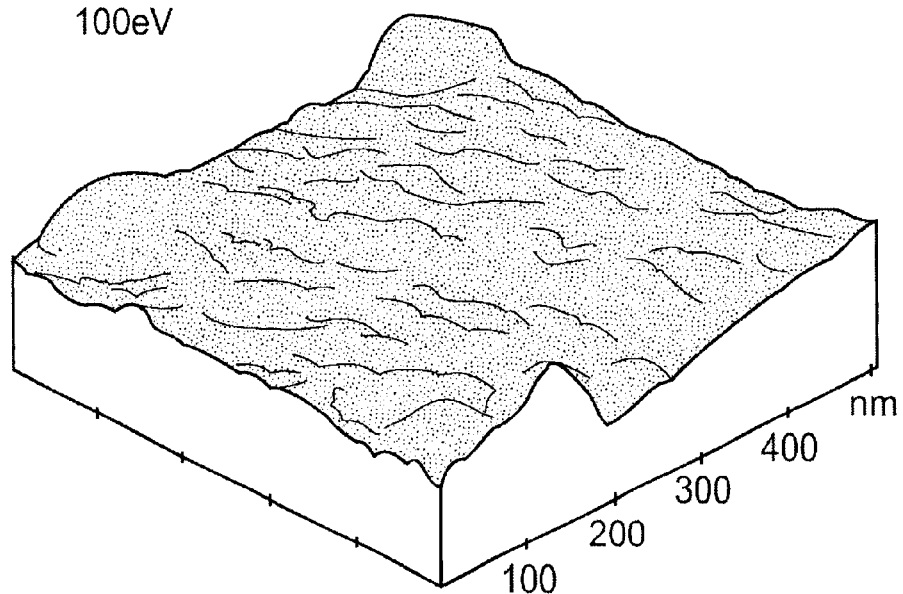
Figure 8E:
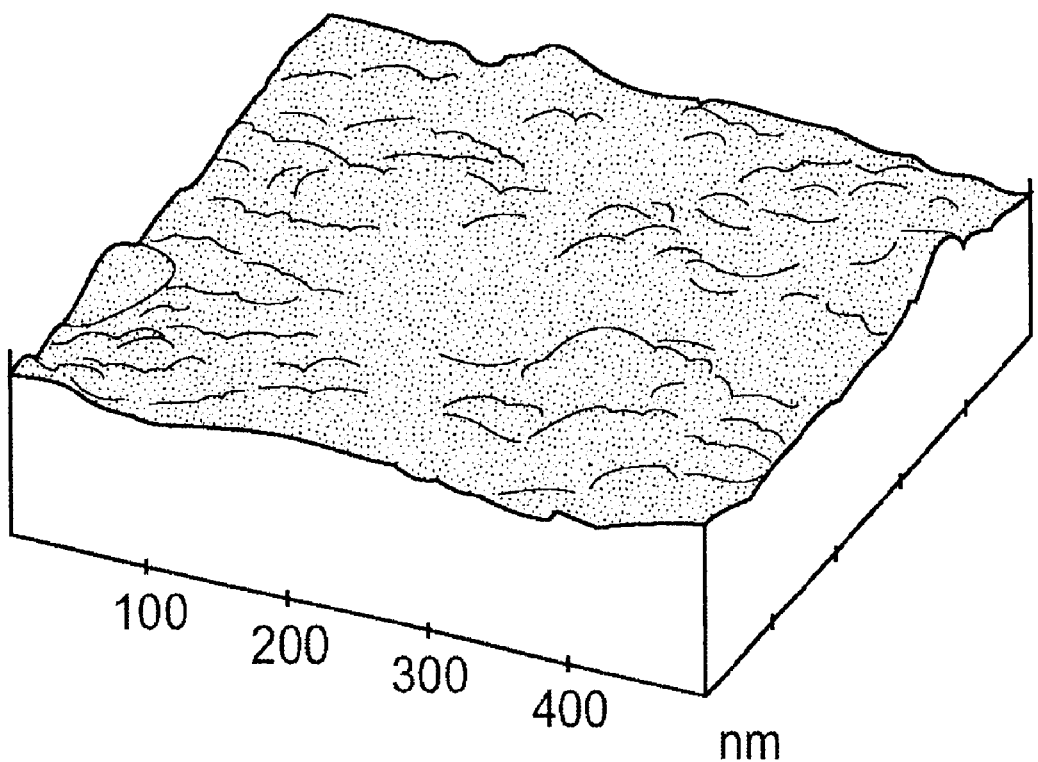

FIG. 7 shows changes in carrier mobility of the various ITO thin films formed by the magnetron negative ion sputter system using different ion beam energies in the present invention. A Hall effect measurement using a Van Der Pauw method is used in determining a carrier mobility. As shown in FIG. 7, a carrier mobility is proportionally increased with an ion beam energy.

FIGS. 8A to 8E are images scanned by atomic force microscopy (AFM) of the various ITO thin films formed by the magnetron negative ion sputter system using different ion beam energies in the present invention. Changes in surface morphology of the ITO films with an ion beam energy is shown in the AFM images. The ITO film deposited at the ion beam energy of 50 eV exhibits the characteristics of a polycrystalline thin film having a grain structure larger than other conditions. With increasing ion beam energy, an average grain size becomes smaller. Also, the ITO films deposited at a higher ion beam energy range tend to be significantly rougher than those deposited with lower ion beam energies. A surface morphology of the ITO films is very important in considering TFT-LCD applications because a rough surface causes a charge carrier scattering which reduces an electrical conductivity. In addition, the rough surface causes a low optical transmittance due to a scattering loss.

Figure 9:
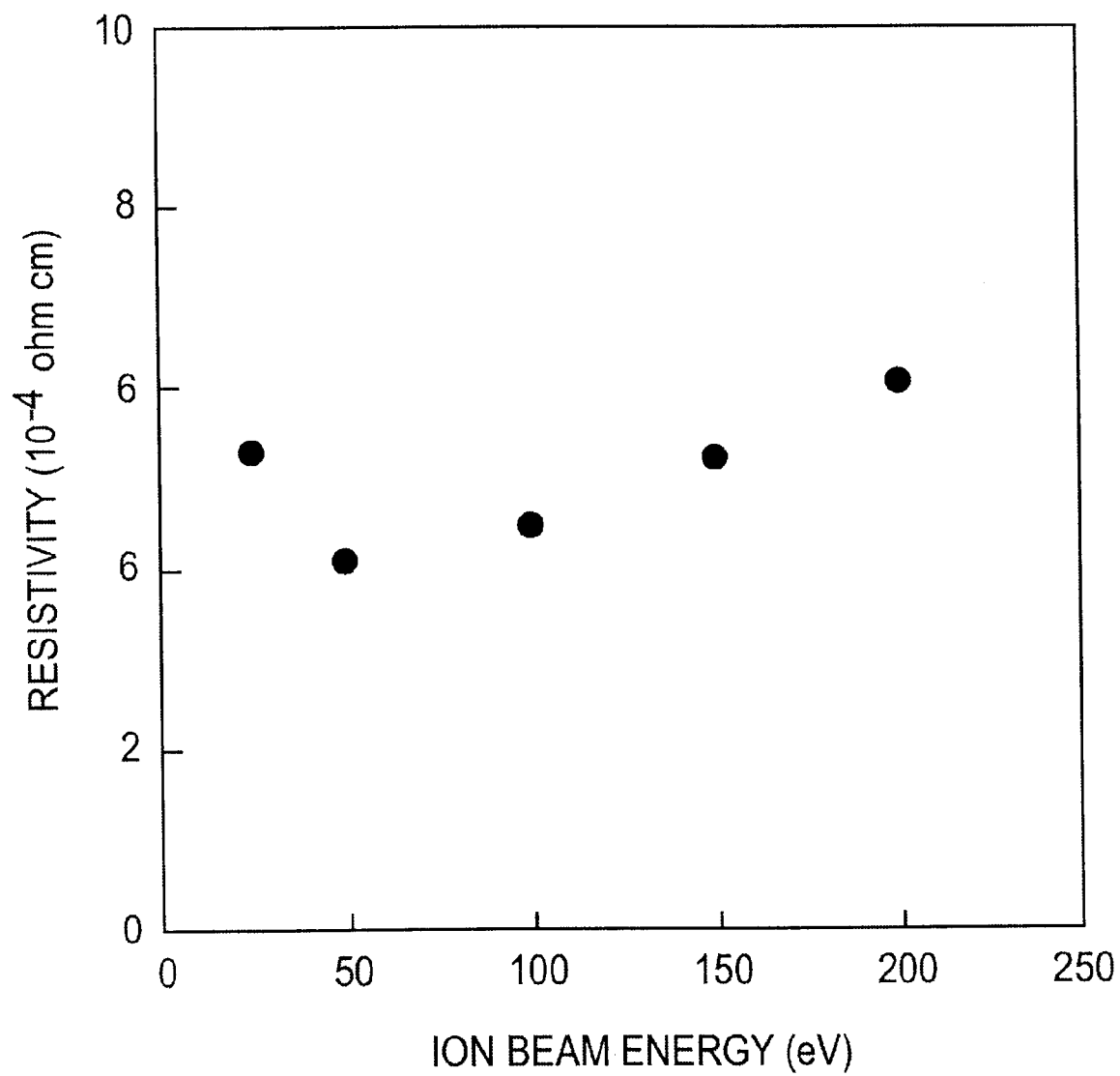
FIG. 9 shows changes in resistivity of the various ITO thin films formed by the magnetron negative ion sputter system using different ion beam energies in the present invention.

FIG. 9 shows changes in resistivity of the various ITO thin films formed by the magnetron negative ion sputter system using different ion beam energies in the present invention. A resistivity of the ITO thin film was measured by a four-point probe method. As shown in FIG. 9, the ITO thin film formed at the 50 eV ion beam energy has a resistivity of an order of $10^{-4}$ $\Omega$cm. The increase in resistivity at the energies higher than 50 eV is due to a smaller grain size and a surface damage by a high ion beam energy bombardment. This result is very consistent with the XRD and AFM measurements. Therefore, in order to increase the grain size effectively, secondary ion beam energies are controlled precisely to have a low kinetic energy ratio.

In the present invention, a polycrystalline ITO thin film on the glass substrates is formed by a negative ion sputter source without heating the substrate. Also, an effect of an ion beam energy on the crystallinity, resistivity, optical transmittance, and surface morphology are also disclosed. As discussed above, crystallinity, transmittance, and electrical properties of the ITO films are controlled by the secondary ion beam energy. Accordingly, the method of forming an ITO thin film using the magnetron negative ion sputter source in the present invention enables to form an ITO thin film having desirable properties for optoelectronic devices, such as a high transmittance as well as a low resistivity. Further, since the method is a low temperature process, an ITO film may be formed on an organic or any temperature sensitive substrates.

It will be apparent to those skilled in the art that various modifications and variations can be made in a method of forming an indium tin oxide thin film using a negative ion sputter source of the present invention without departing from the spirit or scope of the invention. Thus, it is intended that the present invention covers the modifications and variations of this invention provided they come within the scope of the appended claims and their equivalents.

What is claimed is:

1. A method of forming an indium tin oxide thin film on a substrate, the method comprising the steps of:

introducing a mixture of an inert gas and a low electron affinity element in close proximity to a target as a primary sputter ion beam source;

providing an oxygen gas between the target and the substrate;

applying an electrical energy to the target to ionize the mixture;

confining electrons generated in the ionization in close proximity to a surface of the target facing towards the substrate;

disintegrating negatively charged ions from the target; and forming the indium tin oxide thin film on the substrate.

2. The method according to claim 1, wherein the negatively charged ions include $In^-$, $Sn^-$, $O^-$, and $O^-_2$.

3. The method according to claim 1, further comprising the step of evacuating a process chamber prior to the step of introducing a mixture.

4. The method according to claim 3, wherein the low electron affinity element includes at least one of cesium, rubidium, and potassium.

5. The method according to claim 1, wherein the indium tin oxide thin film has at least 90% optical transmittance as well as a resistivity of an order of $10^{-4}$ $\Omega$cm.

6. The method according to claim 1, wherein the substrate is either grounded or positively biased with respect to the target.

7. The method according to claim 1, wherein the negatively charged ions have an ion beam energy approximately the same as a potential difference between the substrate and the target.

8. The method according to claim 7, wherein the ion beam energy decreases with an increase in a working pressure.

9. The method according to claim 1, wherein the substrate is maintained at a temperature in the range of about 25° C. to 100° C.

10. The method according to claim 1, wherein the substrate includes a glass.

11. The method according to claim 1, wherein the target has at least one through-hole therein, so that the mixture is diffused through the through-hole onto a surface of the target facing toward the substrate.

12. The method according to claim 1, wherein the electrical energy applied to the target is in the range of 25 to 1000 eV.

13. A method of forming an indium tin oxide thin film using a sputter system, the method comprising the steps of:

cleaning a substrate;

placing the substrate in a process chamber;

evacuating the process chamber where a sputter action occurs between a target and the substrate, wherein the target has first and second sides;

introducing a mixture of argon and cesium to the second surface of the target as a primary sputter ion beam source, wherein the target has at least one through-hole;

diffusing the mixture through the through-hole in the target from the second surface to the first surface;

providing an oxygen gas between the target and the substrate;

maintaining the process chamber to have a constant working pressure;

applying an electrical energy to the target to ionize the mixture;

confining electrons generated in the ionization in close proximity to the first surface of the target;

disintegrating negatively charged ions from the target; and forming the indium tin oxide thin film on the substrate.

14. The method according to claim 13, wherein the negatively charged ions include $In^-$, $Sn^-$, $O^-$, and $O^-_2$.

15. The method according to claim 13, wherein the substrate is either grounded or positively biased with respect to the target.

16. The method according to claim 13, wherein the substrate is maintained at a temperature in the range of about 25° C. to 100° C.

17. The method according to claim 13, wherein the substrate includes a glass.

18. The method according to claim 13, wherein the negatively charged ions have an ion beam energy approximately the same as a potential difference between the substrate and the target.

19. The method according to claim 18, wherein the ion beam energy decreases with an increase in the working pressure.

20. The method according to claim 13, wherein the electrical energy applied to the target is in the range of 25 to 1000 eV.

21. The method according to claim 13, wherein the indium tin oxide thin film has at least 90% optical transmittance as well as a resistivity of an order of $10^{-4}$ $\Omega$cm.

* * * * *